United States Patent [19]

Grubbs et al.

[11] Patent Number: 5,142,369

[45] Date of Patent: Aug. 25, 1992

[54] FIRST IF FILTER WITH FIXED SECOND HALF-IF TRAP FOR USE IN AN FM RADIO IN A TELEVISION RECIEVER

[75] Inventors: Gary D. Grubbs; Leroy S. Wignot, both of Indianapolis, Ind.

[73] Assignee: Thomson Consumer Electronics, Inc., Indianapolis, Ind.

[21] Appl. No.: 561,584

[22] Filed: Aug. 6, 1990

[51] Int. Cl.⁵ ............................................. H04N 5/50
[52] U.S. Cl. ............................ 358/191.1; 358/189; 358/196; 358/198; 455/189.1; 455/180.1; 455/191.1
[58] Field of Search ............. 358/191.1, 189, 193.1, 358/188, 196, 198, 197, 195.1; 455/168, 188, 190, 191, 197, 179, 184, 314, 315, 339, 189, 180, 176; 333/175, 167, 184, 185

[56] References Cited

U.S. PATENT DOCUMENTS

| | | | |
|---|---|---|---|
| 4,027,242 | 5/1977 | Yamanaka | 325/17 |
| 4,088,959 | 5/1978 | Sumi | 325/459 |
| 4,162,451 | 7/1979 | Ash | 455/189 |
| 4,272,788 | 6/1981 | Ogita | 358/189 |
| 4,286,288 | 8/1981 | Waldo | 455/315 |
| 4,352,111 | 9/1982 | Carlson et al. | 343/860 |
| 4,361,906 | 11/1982 | Sakamoto | 455/140 |
| 4,499,602 | 2/1985 | Hermeling | 455/189 |
| 4,553,264 | 11/1985 | Hasegawa | 455/189 |
| 4,574,308 | 3/1986 | Gibson | 358/188 |
| 4,575,761 | 3/1986 | Carlson et al. | 358/191.1 |
| 4,581,643 | 4/1986 | Carlson | 455/315 |
| 4,709,407 | 11/1987 | Baba | 455/315 |
| 4,726,072 | 2/1988 | Yamashita | 455/189 |
| 4,849,721 | 7/1989 | Matsuura | 333/175 |
| 4,881,272 | 11/1989 | Eguchi | 455/180 |
| 4,903,129 | 2/1990 | Bell | 358/198 |
| 4,935,924 | 6/1990 | Baxter | 455/6 |

OTHER PUBLICATIONS

SAMS Photofact Schematic for the Dumont Model RA-119A television receiver, circa 1952.
An article in Funk-Technik, vol. 35, No. 6/1980, pp. 216-226, (translation attached).

*Primary Examiner*—James J. Groody
*Assistant Examiner*—Sherrie Hsia
*Attorney, Agent, or Firm*—Joseph S. Tripoli; Peter M. Emanuel; Thomas F. Lenihan

[57] ABSTRACT

A television receiver includes a single tuner for tuning both television channels and broadcast FM stations. The tuner is operated at a fixed gain setting in FM reception mode. The tuner serves as the first conversion stage of a double conversion FM receiver, wherein the mixer of an FM radio integrated circuit serves as the second conversion stage. The arrangement operates at a specific and non-arbitrary first IF frequency. The FM receiver is also capable of automatically receiving National Weather Service broadcasts on that one of NWS's seven allocated frequencies which is operating in a listener's area. The receiver provides an on-screen display of the currently tuned FM channel number.

5 Claims, 6 Drawing Sheets

FIRST IF FILTER WITH FIXED SECOND HALF-IF TRAP FOR USE IN AN FM RADIO IN A TELEVISION RECIEVER

CROSS REFERENCE TO RELATED APPLICATIONS

Patent applications Ser. Nos. 07/561,589, 07/561,588, 07/561,586, 07/561,585, 07/561,587, and 07/561,583, filed herewith, and assigned to the same assignee as the subject application, contain related subject matter.

1. Field of the Invention

The subject application concerns the field of television receivers including an FM radio.

2. Background of the Invention

It is desirable to have a television receiver which is capable of receiving not only television signals, but also broadcast FM radio signals. In the United States, the broadcast FM band occupies a band of frequencies extending from approximately 88 MHz to approximately 108 MHz. This band of frequencies lies between the frequencies allocated for broadcast television channel 6 and television cable channel 98. Modern intercarrier-sound-type television receivers having the capability to receive broadcast FM signals are known from the prior art. However, in these known arrangements, their respective manufactures added a separate FM radio having its own tuner.

SUMMARY OF THE INVENTION

A single tuner in a television receiver is employed for tuning television signals in at least one band of television frequencies, and broadcast FM radio signals in an FM band of frequencies adjacent to the television band of frequencies. The television Tuner serves as the first frequency conversion stage of a double conversion FM receiver, wherein an FM radio integrated circuit serves as the second frequency conversion stage. It is herein recognized that in a double conversion FM receiver, signals at half-IF frequency of the second IF, occur at a fixed frequency, and can be eliminated without utilizing turnable traps.

DETAILED DESCRIPTION OF THE EMBODIMENT

Figure 1:
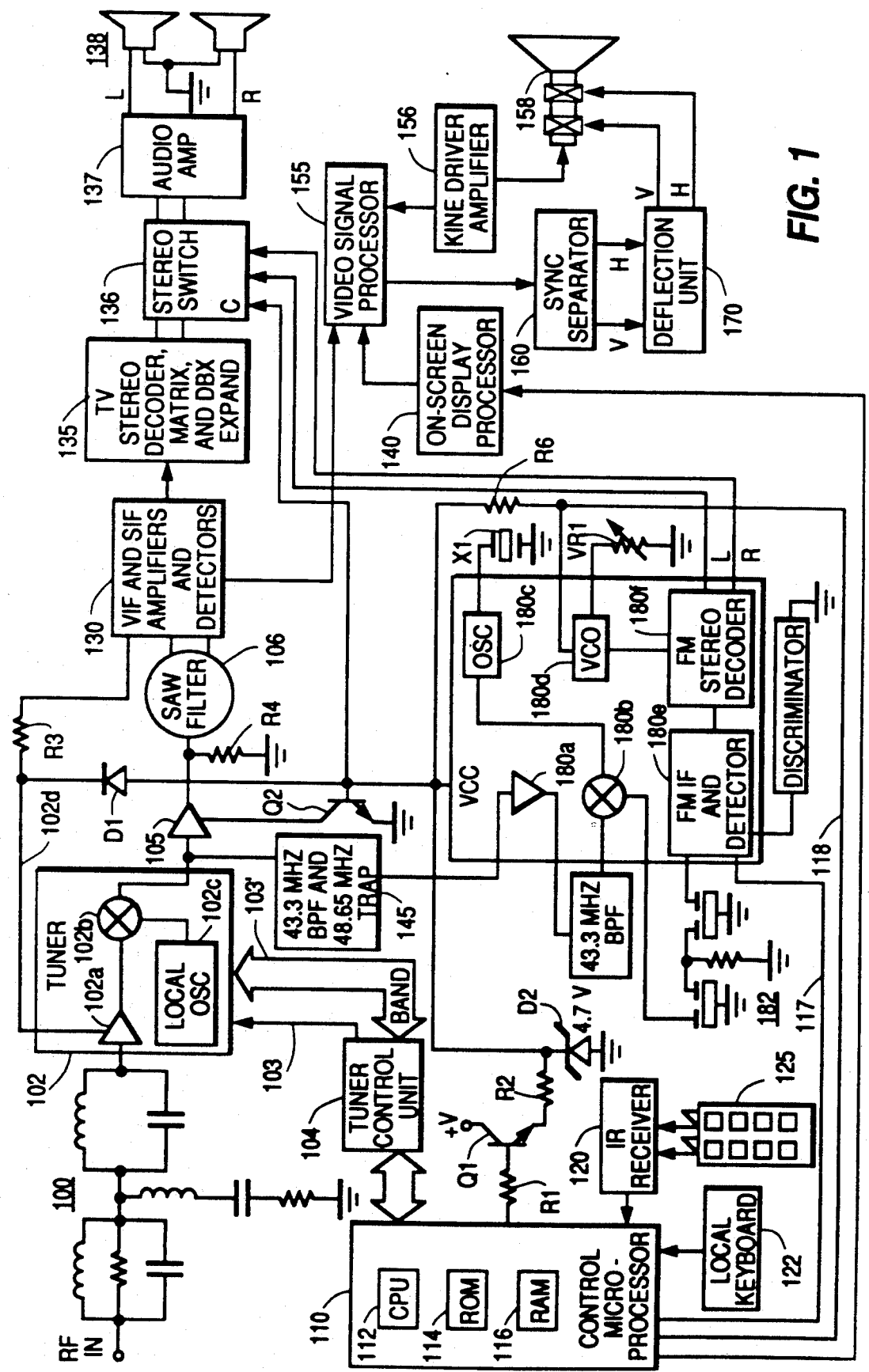
FIG. 1 shows, in block diagram form, a television receiver incorporating the subject invention.

Referring to FIG. 1, television radio frequency (RF) and broadcast FM radio frequency signals are applied to RF input terminal of an FM trap circuit generally designated 100. FM trap 100 will be described in detail below with respect to FIG. 3. RF signals appearing at the output of FM trap 100 are applied to a tuner 102. Tuner 102 includes an RF amplifier 102a for applying RF signals, and applying the amplified RF signals to one input of a mixer 102b. Tuner 102 also includes a local oscillator 102c for generating a local oscillator signal which when applied to a second input of mixer 102b heterodynes with the amplified RF signal and produces an output signal at the television intermediate frequency (IF frequency). Tuner 102 selects a particular RF signal under control of a tuner control unit 104. Alternatively, tuner control unit 104 may also be included within tuner 102. Tuner control unit 104 applies a tuning control signal to tuner 102 via a wire 103, and applies bandswitching signals via a control bus 103'. The tuning control signal and bandswitching signals control the frequency at which local oscillator 102c oscillates, thus determining which RF signal is converted (heterodyned) to the IF frequency. Tuner control unit 104 is controlled by a controller 110. Controller 110, which may be a microprocessor or microcomputer, includes a central processing unit (CPU) 112, a read-only memory (ROM) 114, and a random access memory 116. Controller 110 receives user-entered control signals from a local keyboard 122, and from an infrared (IR) receiver 120. IR receiver 120 receives and decodes remote control signals transmitted by a remote control unit 125.

The intermediate frequency (IF) signal produced by tuner 102 is applied to a surface acoustic wave (SAW) filter preamplifier 105 which amplifies the IF signal and applies it, via SAW filter 106 to a video signal processing unit 130. Video signal processing unit 130 comprises a video IF (VIF) amplifying stage, an automatic gain control circuit (AGC), an automatic fine tuning circuit (AFT), a video detector, and a sound IF (SIF) amplifying stage. Processing unit 130 produces a baseband composite video signal (TV), and a sound carrier signal. The sound carrier signal is applied to an audio signal processor unit 135 which includes a TV stereo decoder, a matrix, and a DBX expander. Audio signal processor unit 135 produces left and right audio signals and applies them to one pair of inputs of an audio switch unit 136. The output of audio switch unit 136 is coupled to an audio amplifier unit 137. Audio amplifier unit 137 produces amplified baseband left and right audio signals and applies them to a pair of speakers 138 for sound reproduction.

The baseband video signal (TV) is coupled to a video processor unit 155 and a kine driver amplifier 156, and ultimately displayed on a display screen of a display device 158. Video signals are also applied to a sync separator unit 160 which derives vertical and horizontal synchronizing signals therefrom. The derived vertical and horizontal signals are applied to a deflection unit 170 for the production of deflection signals for application to the yoke assembly of display device 158. Under control of controller 110, an on-screen display processor 140 generates character signals, and applies them to a second input of video signal processor 155, for display on display device 158. The circuitry described thus far, with the exception of the particular FM trap shown in FIG. 1, is known from the RCA CTC 156 color television chassis.

The intermediate frequency (IF) signal produced by tuner 102 is also applied, via a 43.3 Mhz bandpass filter and 48.65 MHz trap arrangement 145, to a single chip FM radio integrated circuit (IC) 180. FM radio IC 180 is, for example, a CXA12338M/S AM/FM Stereo Radio Circuit manufactured by SONY Corporation. FM radio IC 180 includes an amplifier 180a, a mixer 180b, an oscillator 180c, a voltage controlled oscillator (VCO) 180d, an FM IF and detector unit 180e, and an FM stereo decoder unit 180f.

It is herein recognized that television tuner 102 may be used as the first frequency conversion stage of a double conversion tuner for the FM broadcast band, wherein the second frequency conversion stage of the double conversion tuner is provided by FM radio IC 180. That is, a particular FM radio signal is selected and converted in frequency from one of the FM radio band of frequencies, to a first intermediate frequency of 43.3 MHz. The value 43.3 MHz is important and its selection will be discussed below.

The signals at the first IF frequency are then heterodyned in mixer 180b with the 54.0 MHz oscillator signals produced by fixed frequency crystal-controlled oscillator 180c. It was found that it is desirable to crystal-control oscillator 180c to avoid drifts in frequency due to temperature changes which may occur in and around the area of oscillator 180c. While a 54.0 Mhz crystal can be used, it was found that the third overtone (at 54 MHz) of a standard value 18 MHz crystal could be used as well. The result of the heterodyning process is an FM radio signal at the nominal FM IF frequency of 10.7 MHz, which is then filtered in a ceramic resonator arrangement, generally designated 182. The second ceramic resonator of ceramic resonator arrangement 182 was added to improve selectivity. Signals at the output of ceramic resonator arrangement 182 are then amplified, detected, and decoded by FM signal processing units 180d, 180e, and 180f, in the normal manner. A potentiometer VR1 is provided for adjustment of the VCO frequency. Decoded left (L) and right (R) stereo signals are applied to a second pair of input terminals of audio switch 136. When the decoded left (L) and right (R) stereo signals are selected by audio switch unit 136, they are applied to audio amplifier 137 for reproduction in speaker arrangement 138. Lines 117 and 118 coupled between FM radio IC 180 and controller 110 convey signals indicative of whether a signal is tuned, and whether a signal is in stereo, respectively.

Tuner 102 is of the frequency synthesis (FS) type, which means that the frequency of the local oscillator can be changed in a series of steps of a given size under control of controller 110. In FM reception mode, controller 110 causes oscillator 102c to change its frequency 31.5 kilohertz steps. This means that there can be a mistuning of an FM station by a maximum of 31.5 kHz/2 or 15.75 kHz error. This is acceptable because FM radio IC 180 has acceptable demodulator characteristics over a range of approximately +/− 110 kHz, and also because the FM broadcast frequencies are spaced 200 kHz apart.

The selection of 43.3 MHz as the frequency for the first IF of the double conversion FM radio receiver will now be explained. As is well known, the amplitude vs. frequency characteristic of the tuner is substantially shaped like a haystack, with the chroma carrier and pix carrier residing at respective sides of the haystack approximately 3 db from the maximum. The approximate center point of the haystack between these two carriers is 44 Mhz. One skilled in the art might believe that this would be the optimum frequency for the first IF of the FM radio system. However, 44 Mhz is almost exactly the half frequency value of the lowest FM radio frequency at 88.1 MHz), and would cause the following problem. The frequencies of the signals applied to a mixer are doubled by the action of mixing. Most of these products are out of band and filtered out by tuned circuits coupled to the output of the mixers. If 44 MHz is used as the first IF frequency, then local oscillator 102c would oscillate at 132.1 MHz in order to tune an 88.1 MHz FM carrier. In that case the following signals would be produced, 132.1 MHz−88.1 MHz=44 MHz (the desired signal); and 2×88.1 MHz−132.1 MHz=44.1 MHz (undesired image). The undesired image signal is well within the bandwidth of the second IF. This situation causes interference and distortion at the system audio outputs. This is further complicated by the fact that tuner FM traps give very little attenuation at 88.1 MHz causing intermodulation distortion in the tuner to happen at relatively low input signal levels. Frequencies greater than 44 Mhz, but less than the pix carrier at 45.75 MHz, would cause image problems on higher FM radio stations. The best value therefore is one below 44 MHz, but higher than the color subcarrier at 42.17 MHz (because going lower than the color subcarrier would cause the signal to drop rapidly down the "haystack"). The value 43.3 MHz is close enough to the crest of the haystack to provide symmetrical signals, and far enough away from 44 MHz to avoid image interference problems. When 44.3 MHz is selected as the first IF frequency, local oscillator 102c would be controlled to oscillate at 131.4 MHz in order to select an FM carrier at 88.1 MHz. this produces the following output signals, 131.4 MHz−88.1 MHz=43.3 MHz (the desired signal); and 2×88.1 MHz−131.4 MHz=45.8 MHz (undesired image). The undesired image signal is now 2.5 MHz away from the desired signal, is well outside the 300 kHz bandwidth of the second IF stage, and will not cause distortion. In fact, a signal having a frequency between 43.5 MHz and the color subcarrier frequency, is a good candidate for the first IF of the above-described double conversion tuner.

Figure 6A:
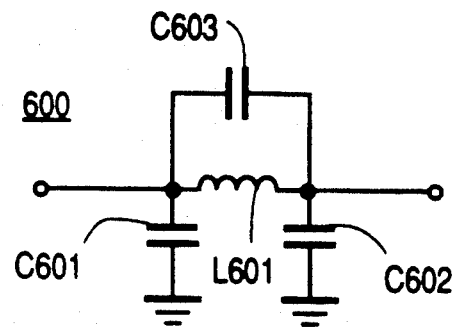
FIGS. 6A and 6B show the combined 43.3 MHz bandpass filter and 48.65 MHz half-IF trap of FIG. 1.
Figure 6B:
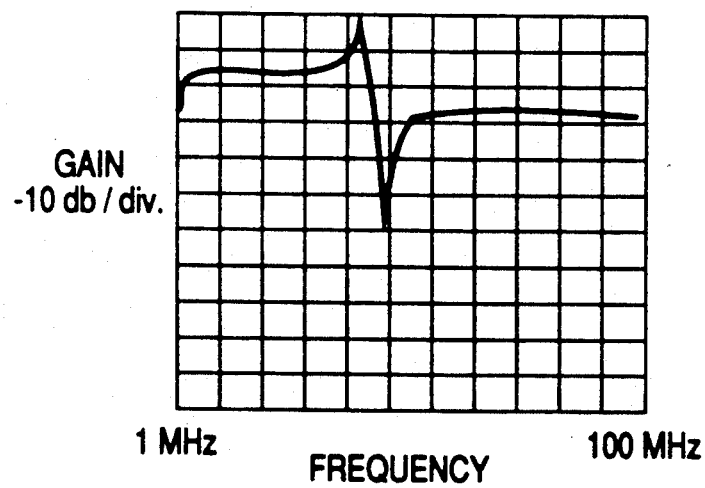

Similarly, the second IF has an image problem to be avoided. Specifically, a signal at 48.65 MHz (i.e., 43.3 MHz +5.35 MHz (one-half the second IF frequency of 10.7 MHz)) would cause an image to appear at 10.7 MHz, again causing interference. Because the second IF frequency is fixed at 10.7 MHz, this problem is eliminated in filter unit 145 without having to employ tracking filters. The circuitry of filter unit 145 is shown in detail in FIG. 6A. The 43.3 MHz bandpass filter comprises a pi-type arrangement of an inductor L,601, and capacitors C601 and C602. A trap at 48.65 Mhz was obtained by adding a capacitor C603 in parallel with inductor L601. The gain vs. frequency characteristic for this arrangement is shown in FIG. 6B. The following component values are preferred:

| | |
|---|---|
| L601 | 101 nanohenries |
| C601 | 39 picofarads |
| C602 | 120 picofarads |
| C603 | 100 picofarads |

In operation, controller 110 receives a command, via local keyboard 122, or via IR receiver 120, to enter the FM radio mode. In response, controller 110 applies a signal to the base of transistor Q1 via resistor R1. Transistor Q1 switches on and provides a source of supply voltage to a voltage regulator circuit R2, D2 which in turn provides power (VCC) to operate FM radio IC 180. This switched VCC is also applied to the control terminal of stereo switch 136 and causes the selection the FM radio audio signals in FM radio mode.

There are two obstacles to good FM reception performance, poor sensitivity and overload, and a carefully chosen compromise between the two must be utilized. Recall that in the television mode of operation, the RF amplifier is gain controlled by an AGC signal derived in the television video IF (VIF) circuitry. In FM mode, the AGC signals are disconnected from the RF amplifier because no meaningful AGC signals are being produced in the VIF circuitry. If the television tuner were to be operated at maximum gain in FM reception mode, medium to strong level FM signals would overdrive the tuner mixer and RF stages, creating unwanted distortion products. Providing a separate FM AGC arrangement is simply unacceptable due to the cost and complexity which would be added to the television receiver. The solution is to operate the RF stage of the tuner at a fixed gain during FM reception mode. The arrangement has a much lower cost, adding only a few components. The gain reduction must be chosen carefully. Too much gain reduction would produce poor FM reception sensitivity, and too little gain reduction yields an overload situation. A second factor which aids to make operation of the RF stage at a reduced gate function well, is the fact that the noise figure of the gain reduced RF amplifier stage is degraded (becomes higher) at a much slower rate than the rate for the gain reduction, thus maintaining a better signal to noise ratio. This permits compensation for the RF amplifier gain reduction to be placed in a subsequent IF postamplifier stage, to maintain overall receiver sensitivity.

Disconnecting of the AGC signals is accomplished by applying the 4.7 volt FM radio switched VCC to AGC line 102d via a diode D1. The FM radio VCC supply is well regulated enough to yield gain reductions which fall within acceptable tolerances. It is important to note that the FM radio IC chosen has a wide range of usable operating voltages. The 4.7 volt level was specifically chosen to fit the needs of the television tuner RF gain reduction bias. A resistor R3 isolates the AGC circuitry from the applied VCC. The amplitude of the switched VCC after passing through diode D1 is approximately 4 volts. Applying a fixed 4 volt signal to the AGC control terminal of RF amplifier 102a causes it to operate in a lower gain mode.

The switched FM radio VCC is also applied to the base of SAW filter preamplifier 105 to disable the amplifier and further attenuate unwanted signals at the input of video processing unit 130.

Suprisingly, it was found that an FM trap produces a beneficial effect in a television receiver utilizing a single tuner for receiving both television signals and broadcast FM radio signals. Specifically, the FM trap attenuates the FM radio signals which would otherwise have too great an amplitude at the television tuner input. It is also recognized herein that the FM trap should exhibit a frequency response having relatively sharp "skirts" to minimize interference with signals of adjacent television channels, and having a substantially flat band reject region to provide FM signals having a substantially uniform amplitude throughout the FM radio broadcast band.

Figure 2A:
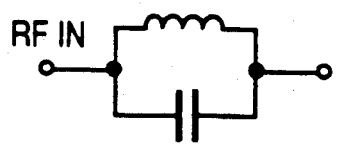
FIG. 2A shows a parallel resonant FM trap as known from the prior art.
Figure 2B:
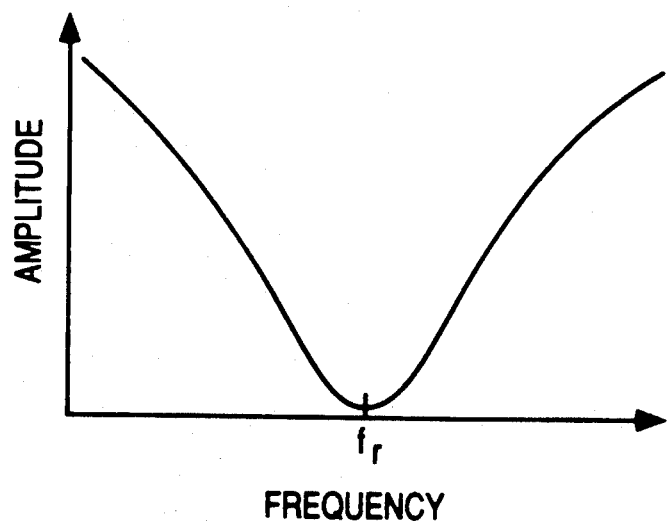
FIG. 2B is a graph of the amplitude vs. frequency characteristic of a parallel resonant circuit of the type shown in FIG. 2A

FIG. 2A shows a parallel resonant FM trap known from the prior art. Series resonant FM traps, and combinations of series and parallel FM traps were also known in the prior art. In each case, however, no effort was made to limit the attenuation of these prior art traps. Instead, each attempted to obtain the deepest possible notch, because in a television receiver without an FM radio, there is no need to preserve any of the broadcast FM signal spectrum. FIG. 2B shows the amplitude vs. frequency characteristic of a parallel resonant circuit, such as shown in FIG. 2A. This arrangement is unsatisfactory for a combined television and FM system for the following reasons. If the resonant frequency of the circuit of FIG. 2A were to be set at the center of the FM band of frequencies, then the amplitudes of signals of the individual respective FM broadcast stations would vary greatly at the input of the RF amplifier. It is also unsatisfactory because of the roll-off of the characteristic (i.e., the slope of the skirts) is not steep enough to provide enough protection from FM interference for the adjacent television channels.

Figure 3A:
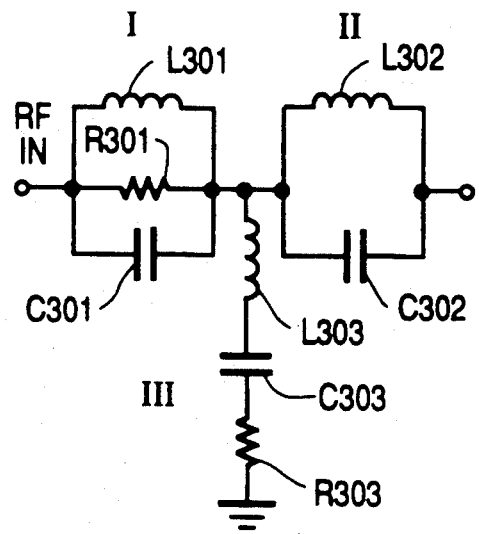
FIG. 3A shows an FM trap in accordance with the subject invention.

Tuning now to FIG. 3A, a three-section FM trap is shown which overcomes the above-noted problems of the prior art FM traps. Section I of the three-section FM trap comprises a parallel arrangement of an inductor L301, a resistor R301, and a capacitor C301. Section I is tuned to 97.5 MHz to make the frequency response of the overall arrangement as uniform as possible. Section II of the three-section FM trap comprises a parallel arrangement of an inductor L302 and capacitor C302. Section II is tuned to 104.0 MHz to provide protection for VHF channels 12 & 13 (in the U.S.). Section III of the three-section FM trap comprises a series resonant circuit disposed from a point between Sections I and II, to a point of reference potential (i.e., signal ground). Section III is tuned to 90.5 MHz to protect low band VHF channel 6 against educational FM transmissions which are as close as 88.1 MHz. Resistors R301 and R303 set the trap depth. It should be noted that Section II needs no additional loading since the loading effects of the antenna filter circuitry which follows it, reduces the trap depth of Section II to the amount desired. The above-described arrangement leaves the channel 6 chroma carrier essentially unmodified in level, but pulls down the channel 6 sound carrier about 3-4 db, which is felt to be acceptable. The cable channel A-2 (i.e., 98) picture (pix) carrier is reduced by approximately 1 db, but this too is felt to be acceptable.

The following component values are preferred.

| Section I | L301 | approx. 18.3 nanohenries (adjust.) |
|---|---|---|
| | R301 | 270 ohms |
| | C301 | 150 picofarads |
| Section II | L302 | approx. 16.2 nanohenries (adjust.) |
| | C302 | 150 picofarads |
| Section III | L303 | approx. 680 microhenries (adjust.) |
| | R303 | 6.8 ohms |
| | C303 | 4.7 picofarads |

Figure 3B:
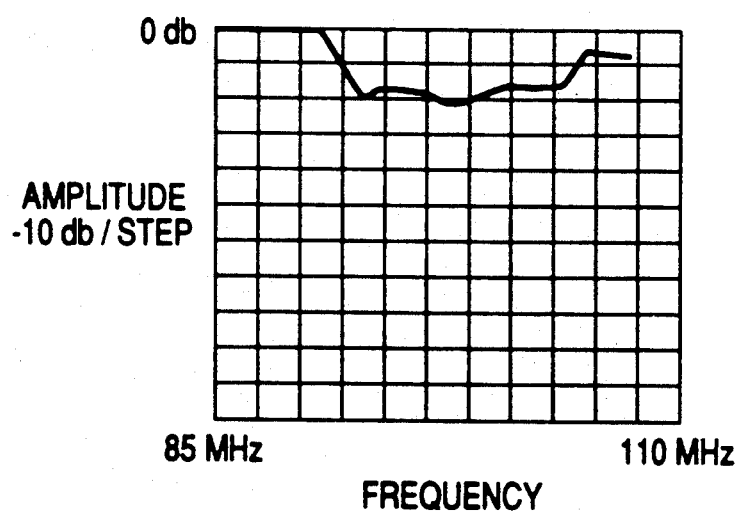
FIG. 3B is a graph of the amplitude vs. frequency characteristic of the FM trap of FIG. 3A and antenna input circuitry, when the tuner is turned to channel 6.

The above-described three-section FM trap provides a uniform level of rejection to signals in the 88 MHz to 108 MHz range of approximately 10 +/− 4 db, during the FM reception mode of operation. When the tuner is tuned to channel 6, however, the FM band rejections, as shown in FIG. 3B, are in the range of 18-22 db due to the added selectively of the antenna input circuitry. The response characteristic shown in FIG. 3B was measured at the drain terminal of the RF amplifier dual-gate FET transistor Q501 of FIG. 5.

The three-section FM trap described above exhibits the following typical performance (referenced against the broadcast television channel pix carrier).

| Frequency (MHz) | Response (db) |
|---|---|
| 83.25 (chan 6 pix ref) | −0 |
| 86.83 (chan 6 chroma) | −0.2 |
| 87.75 (chan 6 sound) | −2.7 |
| 88.1 (lowest FM station) | −4.6 |
| 88.3 | −5.4 |
| 88.5 | −6.2 |
| 88.7 | −7.1 |
| 88.9 | −8.0 |
| 89.1 | −9.0 |
| 90.1 | −12.6 |
| 90.5 | −12.2 |
| 91.1 | −10.1 |
| 92.1 | −8.2 |
| 93.1 | −7.6 |
| 94.1 | −8.0 |
| 95.1 | −9.0 |
| 96.1 | −10.3 |
| 97.1 | −11.1 |
| 98.1 | −10.8 |
| 99.1 | −9.9 |
| 100.1 | −9.0 |
| 101.1 | −8.7 |
| 102.1 | −9.2 |
| 103.1 | −10.7 |
| 104.1 | −11.8 |
| 105.1 | −7.8 |
| 106.1 | −3.3 |
| 107.1 | −0.8 |
| 107.9 (top FM station) | −0.4 |

The desired end result of the trap attenuations by themselves, is that a required reduction of overall tuner gain at the FM band of frequencies is achieved. Compared to the average power gain of adjacent television channels 6 and 98, the reduction of the overall tuner gain at the following FM band frequencies is realized.

| FREQUENCY (MHz) | TYPICAL AVERAGE LOSS RELATIVE TO THE AVERAGE POWER GAIN OF ADJACENT TELEVISION CHANNELS 6 AND 98 (db) |
|---|---|
| 88.1 | 7.5 |
| 90.5 | 13 |
| 93.5 | 12 |
| 97.5 | 12 |
| 100.7 | 10.5 |
| 104.1 | 6.5 |
| 107.9 | 0 |

Figure 4:
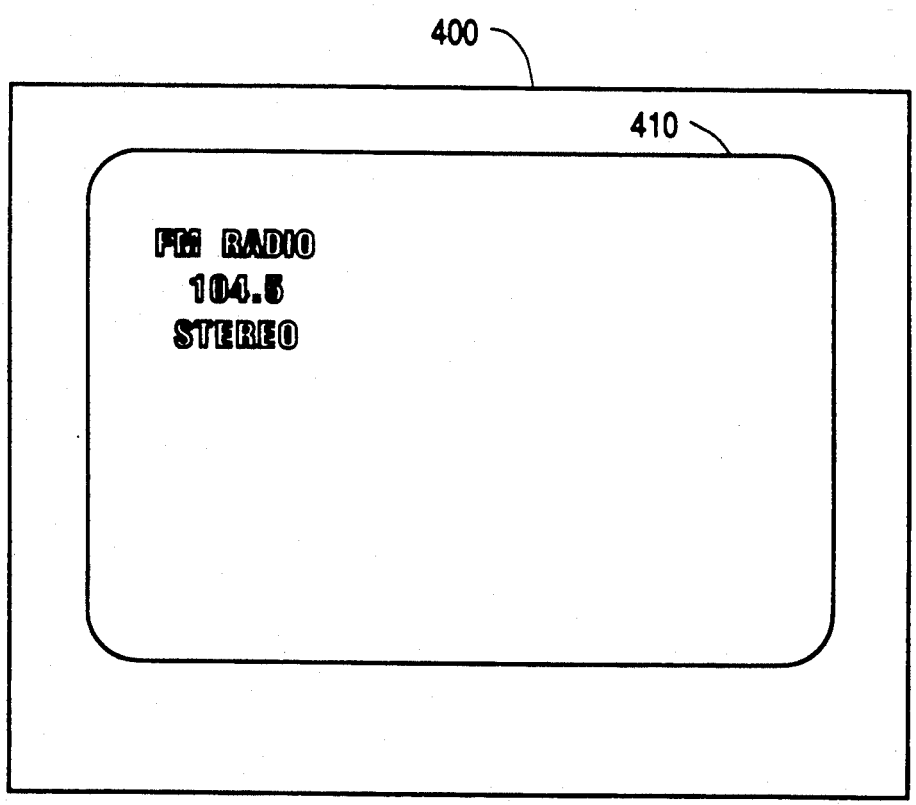
FIG. 4 is an illustration showing a display screen produced in accordance with the invention.

During FM reception mode no television images are available for viewing. Accordingly, when an FM station is selected controller 110 causes on-screen display processor 140 to display a message indicating to a user that the television receiver is in FM mode, that a particular FM station has been selected and whether or not the received FM signal is in stereo. Such a display is shown in FIG. 4, wherein a message is displayed on the screen 410 of a television receiver 400. The display is presented to the user for a predetermined period of time (perhaps 30 seconds), after which there is displayed a blank screen.

Figure 5:
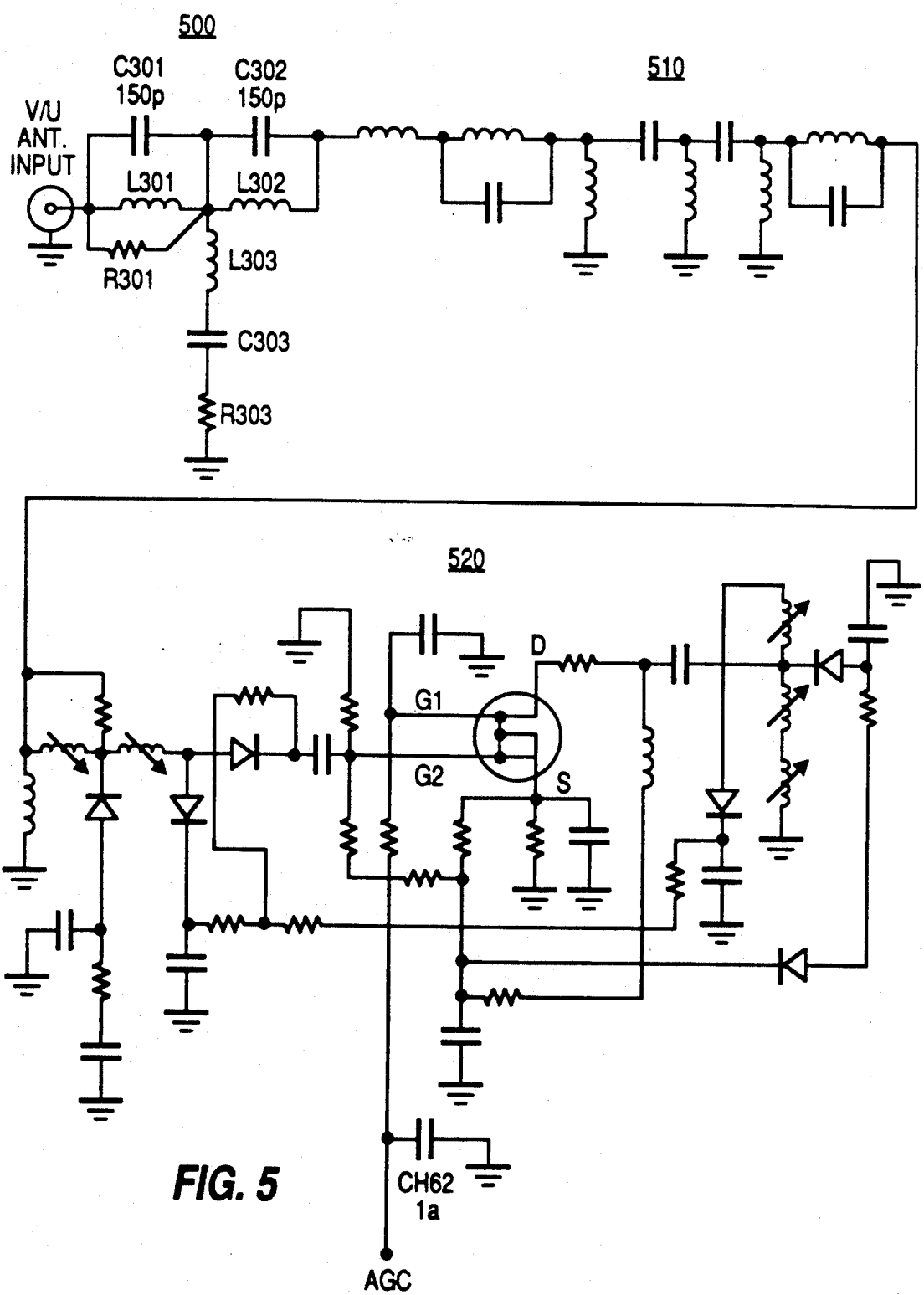
FIG. 5 is an illustration of a portion of the tuner of FIG. 1, showing the connection of the FM trap of FIG. 3A.

FIG. 5 shows in detail the connection of the FM trap circuit of FIG. 3A to a simplified version of a portion of tuner 102. Specifically, the output of FM trap 500 is coupled through a series inductor, to a series of traps, generally designated 510. Traps 510 have a first parallel trap tuned to the TV IF frequency, a second shunt series trap to remove all signals below channel 2, and a second parallel trap also tuned to the TV IF frequency. The output of traps 510 is applied to the input of RF amplifier, generally designated 520. A tuner of this type is known from the MTP-M2016 tuner used with the CTC-156 chassis manufactured by Thomson Consumer Electronics, Inc., Indianapolis, Ind., and does not need to be described in detail.

It is also recognized herein that the subject apparatus can be used to tune broadcasts of the National Weather Service (NWS). These broadcasts are allocated to the following seven frequencies: 162,400 MHz, 162,425 MHz, 162.450 MHz, 162,475 MHz, 162,500 MHz, 162.525 MHz, and 162.550 MHz. Only one of these frequencies is assigned to a given geographic area. Typical weather radio receivers provide a switch for selecting one of three crystal controlled frequencies for receiving the broadcast.

It is further recognized herein that when NWS mode is selected only the center of the NWS band need be tuned. This is true for three reasons. First, the IF filters have a 190 kHz 3 db bandwidth which is greater than the 150 kHz total channel spacing of the NWS band. Second, the discriminator used performs well, even +/− 1000 kHz from the tuned frequency. Third, there is little or no overlap of the NWS stations (because the NWS frequencies are reserved, and because there is only one transmitter operating in a given area).

It is herein specifically recognized that the subject invention is also useful in videocassette recorders (VCRs). The term television receiver, as used herein, includes television receivers having a display device (commonly known as television sets) and television receivers without a display device, such as VCRs.

What is claimed is:

1. A television receiver, comprising:
   tuner means for operating in a first mode for receiving television RF signals, said tuner means selecting a particular television RF signal from a plurality of television RF signals in response to a control signal;
   control means for generating said control signal for causing said tuner means to select said particular RF signal;
   said tuner means also operating in a second mode as a first frequency conversion stage for a double conversion broadcast FM radio signal receiver, for converting broadcast FM radio signals to a first intermediate frequency;
   a second frequency conversion stage of said double conversion broadcast FM radio signal receiver, said second frequency conversion stage receiving said signals at said first intermediate frequency and converting said signals to a second intermediate frequency; and
   means for demodulating audio signals form said signals at said second intermediate frequency; and wherein
   said first intermediate frequency is 43.3 MHz;
   said receiver further comprising a fixed frequency tuned circuit including an inductor, a first capacitor, and a second capacitor arranged as a pi-section filter, and including a third capacitor in parallel with said inductor, said fixed frequency tuned circuit forming a bandpass filter for said first intermediate frequency, and a half-IF trap for said second intermediate frequency, said fixed frequency tuned circuit receiving said signals from said first frequency conversion stage. filtering said signals received from said first frequency conversion stage, and applying said filtered signals to said second frequency conversion stage.

2. The television receiver of claim 1, wherein said second intermediate frequency is 10.7 MHz, and said half-IF trap is tuned to attenuate signals at 48.65 MHz.

3. A television receiver, comprising:

tuner means for operating in a first mode for receiving television RF signals, said tuner means selecting a particular television RF signal from a plurality of television RF signals in response to a control signal;

control means for generating said control signal for causing said tuner means to select said particular RF signal;

said tuner means also operating in a second mode as a first frequency conversion stage for a double conversion broadcast FM radio signal receiver, for converting broadcast FM radio signals to a first intermediate frequency;

a second frequency conversion stage of said double conversion broadcast FM radio signal receiver, said second frequency conversion stage receiving filtered signals at said first intermediate frequency and converting said signals to a second intermediate frequency; and means for demodulating audio signals from said signals at said second intermediate frequency; and wherein said receiver further comprising a fixed frequency tuned circuit forming both a bandpass filter for said first intermediate frequency, and a half-IF trap for said second intermediate frequency, said fixed frequency tuned circuit receiving said signals from said first frequency conversion stage, filtering said signals received from said first frequency conversion stage, and applying said filtered signals to said second frequency conversion stage.

4. The television receiver of claim 3, wherein said first intermediate frequency is 43.3 MHz; and said fixed frequency tuned circuit includes an inductor, a first capacitor, and a second capacitor arranged as a pi-section filter, and includes a third capacitor in parallel with said inductor.

5. The television receiver of claim 4, wherein said second intermediate frequency is 10.7 MHz, and said half-IF trap is tuned to attenuate signals at 48.65 MHz.

* * * * *